United States Patent
Tsuda

(10) Patent No.: US 12,336,085 B2
(45) Date of Patent: Jun. 17, 2025

(54) STRUCTURE AND STRUCTURE WITH ELECTRONIC COMPONENT

(71) Applicant: Murata Manufacturing Co., Ltd., Nagaokakyo (JP)

(72) Inventor: Kazunori Tsuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 261 days.

(21) Appl. No.: 18/132,458

(22) Filed: Apr. 10, 2023

(65) Prior Publication Data

US 2023/0247756 A1    Aug. 3, 2023

Related U.S. Application Data

(63) Continuation of application No. PCT/JP2021/033747, filed on Sep. 14, 2021.

(30) Foreign Application Priority Data

Nov. 6, 2020  (JP) .................. 2020-185615

(51) Int. Cl.
*H05K 1/02* (2006.01)
*H01L 23/64* (2006.01)
(Continued)

(52) U.S. Cl.
CPC .......... *H05K 1/0215* (2013.01); *H01L 23/642* (2013.01); *H05K 3/32* (2013.01); *H05K 7/1092* (2013.01)

(58) Field of Classification Search
CPC ...... H05K 1/0215; H05K 3/32; H05K 7/1092; H01L 23/642

(Continued)

(56) References Cited

U.S. PATENT DOCUMENTS

| 5,792,293 A | 8/1998 | Inasaka |
| 6,176,709 B1 | 1/2001 | Sonobe et al. |

(Continued)

FOREIGN PATENT DOCUMENTS

| JP | 07193350 A | 7/1995 |
| JP | 07202437 A | 8/1995 |

(Continued)

OTHER PUBLICATIONS

International Search Report in PCT/JP2021/033747, mailed Dec. 7, 2021, 3 pages.

(Continued)

*Primary Examiner* — Andargie M Aychillhum
(74) *Attorney, Agent, or Firm* — Keating & Bennett, LLP

(57) ABSTRACT

A structure includes a main substrate including a first surface and a second surface opposite to the first surface, a power supply module on the main substrate, a socket in the main substrate, and one or more power supply wirings and one or more signal wirings extending in a thickness direction of the main substrate and penetrating the socket. Each of the one or more power supply wirings includes a first end on the first surface side and a second end on a side opposite to the first end. Each of the one or more signal wirings includes a third end to be electrically connected to an electronic component and a fourth end on a side opposite to the third end. The fourth end is electrically connected to a conductor pattern on the first surface.

16 Claims, 13 Drawing Sheets

(51) Int. Cl.
  *H05K 3/32* (2006.01)
  *H05K 7/10* (2006.01)
(58) Field of Classification Search
  USPC .......................................................... 361/748
  See application file for complete search history.

(56) References Cited

U.S. PATENT DOCUMENTS

2012/0068629 A1*  3/2012  Matsuda .............. H05B 45/345
                                                                       315/313
2020/0350476 A1* 11/2020  Lee ........................ G09F 9/3026

FOREIGN PATENT DOCUMENTS

| | | |
|---|---|---|
| JP | H08111472 A | 4/1996 |
| JP | 09312187 A | 12/1997 |
| JP | 2000195633 A | 7/2000 |
| JP | 2006237233 A | 9/2006 |
| JP | 2009100440 A | 5/2009 |
| JP | 2009145165 A | 7/2009 |
| JP | 2016134543 A | 7/2016 |

OTHER PUBLICATIONS

Written Opinion in PCT/JP2021/033747, mailed Dec. 7, 2021, 4 pages.

\* cited by examiner

STRUCTURE AND STRUCTURE WITH ELECTRONIC COMPONENT

CROSS REFERENCE TO RELATED APPLICATIONS

This application claims the benefit of priority to Japanese Patent Application No. 2020-185615 filed on Nov. 6, 2020 and is a Continuation Application of PCT Application No. PCT/JP2021/033747 filed on Sep. 14, 2021. The entire contents of each application are hereby incorporated herein by reference.

BACKGROUND OF THE INVENTION

1. Field of the Invention

The present invention relates to a structure and a structure with an electronic component.

2. Description of the Related Art

When an electronic component is mounted on a substrate, how to supply power to the electronic component becomes a problem. Japanese Unexamined Patent Application Publication No. 2016-134543 discloses a "semiconductor device" including a semiconductor module and a circuit board. The semiconductor module is connected to the circuit board. A semiconductor element is disposed in the semiconductor module. A power supply wiring is disposed on a surface of the circuit board. An external connection terminal is extended from the semiconductor element, and the external connection terminal is connected to the power supply wiring.

SUMMARY OF THE INVENTION

In the configuration of Japanese Unexamined Patent Application Publication No. 2016-134543, a loss of electric energy in the power supply wiring becomes a problem. In order to suppress the loss, increasing the width of the power supply wiring can be considered. However, if the width of the power supply wiring is increased while a portion of the surface of the circuit board cannot be used for component mounting due to the power supply wiring, the area of the substrate surface occupied by the power supply wiring further increases, and thus the area of the substrate surface that can be used for component mounting further decreases.

Therefore, preferred embodiments of the present invention provide structures capable of reducing or preventing a loss of electric energy in a power supply wiring and securing a large mounting area of a substrate surface.

A structure according to a preferred embodiment of the present invention includes a main substrate including a first surface and a second surface facing a side opposite to the first surface, a power supply module on the main substrate, a socket in the main substrate, and one or more power supply wirings and one or more signal wirings that extend in a thickness direction of the main substrate and penetrate the socket. Each of the one or more power supply wirings includes a first end on the first surface side and a second end on a side opposite to the first end. Each of the one or more signal wirings includes a third end to be electrically connected to an electronic component and a fourth end on a side opposite to the third end. The fourth end is electrically connected to a conductor pattern provided on the first surface.

According to preferred embodiments of the present invention, since the one or more power supply wirings and the one or more signal wirings penetrate the socket in the thickness direction of the main substrate, and each wiring is appropriately connected, a structure is capable of reducing or preventing a loss of electric energy in the power supply wirings and securing a large mounting area of the substrate surface.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
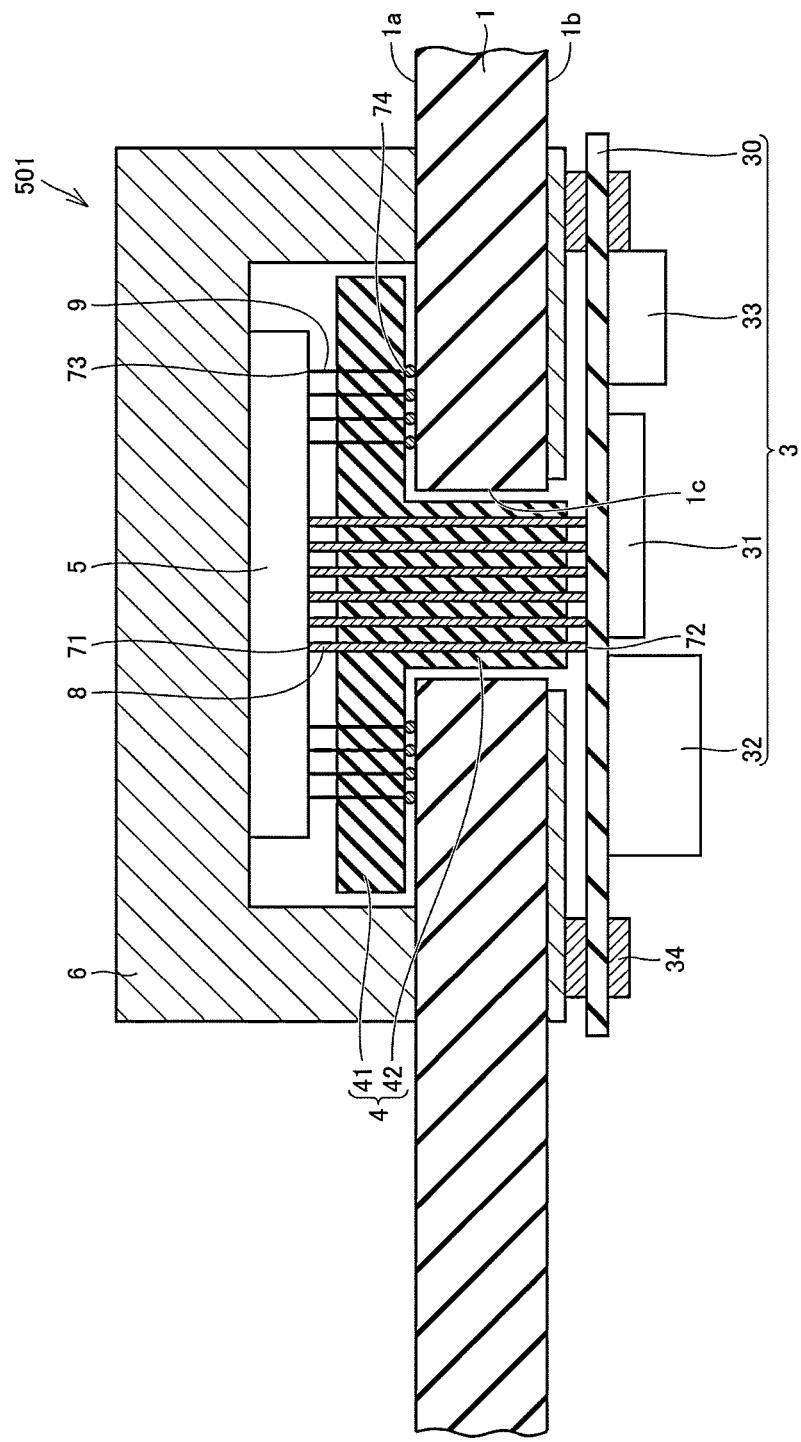
FIG. 1 is a sectional view of a structure with an electronic component according to a first preferred embodiment of the present invention.

Scale ratios in the drawings do not always truly show actual ratios, and scale ratios may be exaggerated for the sake of convenience of illustration. In the following description, when the concept of an upper side or lower side is referred to, it does not mean an absolute upper side or absolute lower side and may mean a relatively upper side or relatively lower side in the illustrated positions.

First Preferred Embodiment

Figure 2:
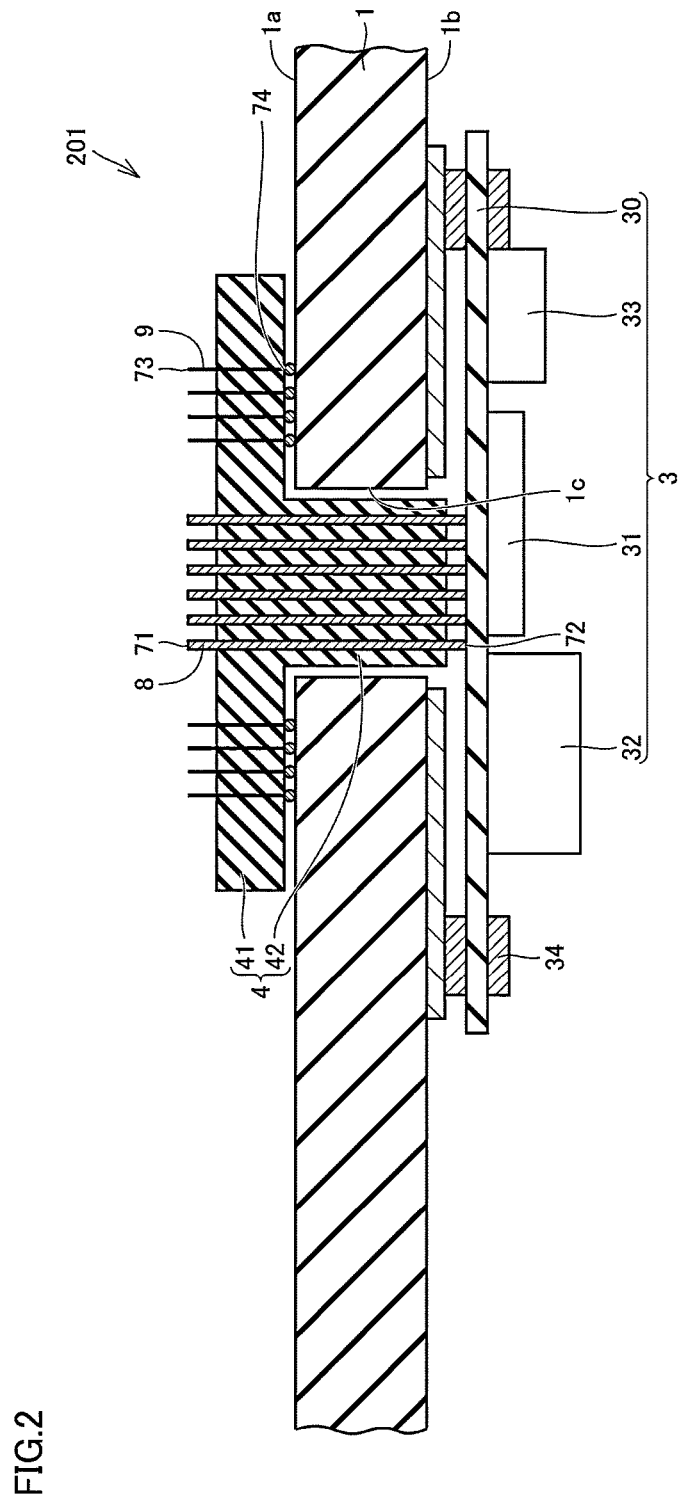
FIG. 2 is a sectional view of a structure according to the first preferred embodiment of the present invention.
Figure 3:
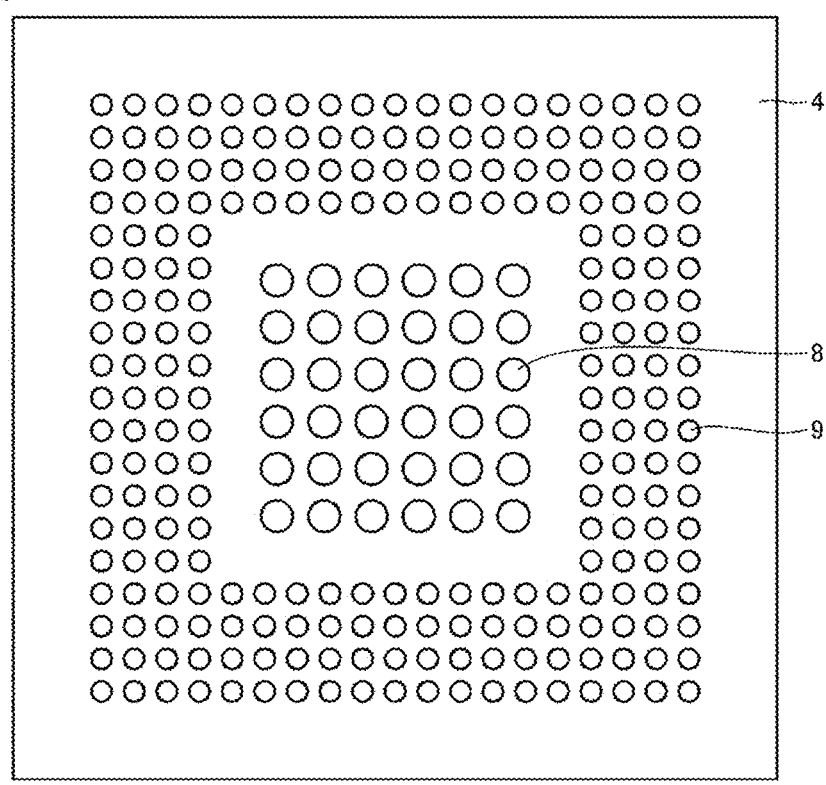
FIG. 3 is a plan view of a socket included in the structure according to the first preferred embodiment of the present invention.

With reference to FIGS. 1 to 3, a structure and a structure with an electronic component according to a first preferred embodiment of the present invention will be described. FIG. 1 is a sectional view of a structure with an electronic component 501. The structure with an electronic component 501 includes an electronic component 5 and a presser 6. The electronic component 5 is, for example, a so-called XPU. That is, the electronic component 5 may be a central processing unit (CPU) or a graphics processing unit (GPU). The presser 6 presses the electronic component 5 down to fix the electronic component 5 to a main substrate 1. The presser 6 includes, for example, a switching lever (not illustrated) and can be switched, as the switching lever is operated, between a state in which the electronic component 5 is pressed down and a state in which the pressing of the electronic component 5 is released.

FIG. 2 illustrates a state in which the electronic component 5 and the presser 6 are removed from the structure with an electronic component 501. FIG. 2 illustrates a structure 201. The electronic component 5 has been pressed against an upper surface of the structure 201 by the presser 6. The configuration of the structure 201 will be described below.

The structure 201 includes the main substrate 1 that includes a first surface 1a and a second surface 1b facing a side opposite to the first surface 1a, a power supply module 3 that is provided on the main substrate 1, and a socket 4 that is provided in the main substrate 1. As the main substrate 1, for example, a glass composite substrate, a glass epoxy substrate, a glass polyimide substrate, and the like can be used. As the material for the socket 4, an insulating resin can be used. The structure 201 includes one or more power supply wirings 8 and one or more signal wirings 9 that extend in a thickness direction of main substrate 1 and penetrate the socket 4. Each of the one or more power supply wirings 8 includes a first end 71 on the first surface 1a side and a second end 72 on a side opposite to the first end 71. The first end 71 is electrically connected to the electronic component 5. The second end 72 is electrically connected to the power supply module 3. Each of the one or more signal wirings 9 includes a third end 73 to be electrically connected to the electronic component 5 and a fourth end 74 on a side opposite to the third end 73. The fourth end 74 is electrically connected to a conductor pattern provided on the first surface 1a. The fourth end 74 may be connected to the first surface 1a with a solder bump interposed therebetween. In the structure 201, a length of a first power supply wiring included in the one or more power supply wirings 8 is different from a length of a first signal wiring included in the one or more signal wirings 9. In the structure 201, each power supply wiring 8 is longer than each signal wiring 9.

FIG. 3 illustrates an upper surface of the socket 4. A plurality of the power supply wirings 8 is arranged in the center. A plurality of the signal wirings 9 is arranged around the plurality of power supply wirings 8 so as to surround the plurality of power supply wirings 8. The diameter of each power supply wiring 8 is larger than the diameter of each signal wiring 9. That is, the power supply wiring 8 is thicker than the signal wiring 9.

Note that components other than the ones illustrated here may be disposed on the first surface 1a of the main substrate 1. The same applies to the second surface 1b of the main substrate 1. As other components, for example, a memory element may be disposed.

Since the present preferred embodiment includes a structure in which, by using the one or more power supply wirings 8 and the one or more signal wirings 9 that penetrate the socket 4 in the thickness direction of the main substrate 1, the electronic component 5 and the power supply module 3 are electrically connected, a power supply wiring does not have to be extended in a direction of a surface of the main substrate 1. Therefore, the electronic component 5 and the power supply module 3 can be electrically connected in a very small area. As a result, a decrease in a mounting area of the substrate surface can be reduced or prevented.

Since the one or more power supply wirings 8 and the one or more signal wirings 9 penetrate the socket 4 in the thickness direction of the main substrate 1, a columnar conductor pattern can be used instead of a thin-film conductor pattern. In particular, since a conductor column having a large diameter can be used where necessary for the power supply wirings 8 that are required to allow a large current to flow therethrough, the electric resistance of the power supply wirings 8 can be reduced. Therefore, a loss of electric energy at the time of supplying power to the electronic component 5 can be reduced.

In this manner, a structure capable of reducing or preventing a loss of electric energy in the power supply wirings and securing a large mounting area of the substrate surface can be achieved.

As illustrated in the present preferred embodiment, the structure with an electronic component 501 includes the structure 201 and the electronic component 5, and the first end 71 and the third end 73 are electrically connected to the electronic component 5. Since the structure with an electronic component 501 includes the structure 201 having the configuration described in the present preferred embodiment, a structure with an electronic component capable of reducing or preventing a loss of electric energy in the power supply wirings and securing a large mounting area of the substrate surface can be achieved. Here, a case in which the structure 201 is included has been exemplified, but the structure with an electronic component may include a structure having other configurations described in the specification, instead of the structure 201.

In the present preferred embodiment, as a preferred example of the structure, a case in which a double-sided mounting structure is adopted has been exemplified (see FIG. 2). That is, as it is preferred in the present preferred embodiment, in the structure 201, the power supply module 3 is provided on the second surface 1b. The power supply module 3 is fixed to the second surface 1b with a screw 34. The main substrate 1 has a through hole 1c that connects the first surface 1a to the second surface 1b. The socket 4 is provided on the first surface 1a. The socket 4 includes a main body portion 41 disposed along the first surface 1a and a projecting portion 42 projecting from the main body portion 41 and inserted into the through hole 1c. The one or more power supply wirings 8 penetrate the projecting portion 42. The length of the first power supply wiring included in the one or more power supply wirings 8 is longer than the length of the first signal wiring included in the one or more signal wirings 9.

By adopting this configuration, the power supply module 3 is disposed on the second surface 1b side, instead of the first surface 1a side on which the electronic component 5 and the presser 6 are disposed, such that the power supply module 3 can be efficiently disposed on the main substrate 1 having a limited area. In particular, when the size of the power supply module 3 is large, by disposing the power supply module 3 on the second surface 1b side, the mounting area on the first surface 1a side can have enough room, and thus the configuration is preferable.

As illustrated in the present preferred embodiment, the one or more power supply wirings 8 are preferably thicker than the one or more signal wirings 9. By adopting this configuration, the electric resistance of the power supply wirings 8 can be reduced. In general, the power supply wirings 8 are required to allow a large current to flow therethrough, and thus the power supply wirings 8 are preferably thick for allowing a large current to flow. In general, since such a large current does not have to flow through the signal wirings 9, the signal wirings 9 may be thin.

As shown in the present preferred embodiment with reference to FIG. 3, when the socket 4 is viewed in a direction perpendicular to the first surface 1a, it is preferable that the signal wirings 9 surround the power supply wirings 8. The power supply wirings 8 extend in the thickness direction toward the power supply module 3, and on the other hand, the signal wirings 9 extend toward various wirings and components provided in the main substrate 1. In this manner, as the signal wirings 9 surround the power supply wirings 8, the signal wirings 9 can easily extend in any outer side direction without being disturbed by the existence of the power supply wirings 8, and thus the configuration is preferable.

As shown in the present preferred embodiment with reference to FIGS. 1 and 2, it is preferable that the first end 71 and the third end 73 are on the same plane. By adopting this configuration, the one or more power supply wirings 8 and the one or more signal wirings 9 can be simultaneously brought into contact with a flat surface of the electronic component 5 with ease. A terminal of the electronic component 5 is sufficient as long as being disposed on the flat surface.

Second Preferred Embodiment

Figure 4:
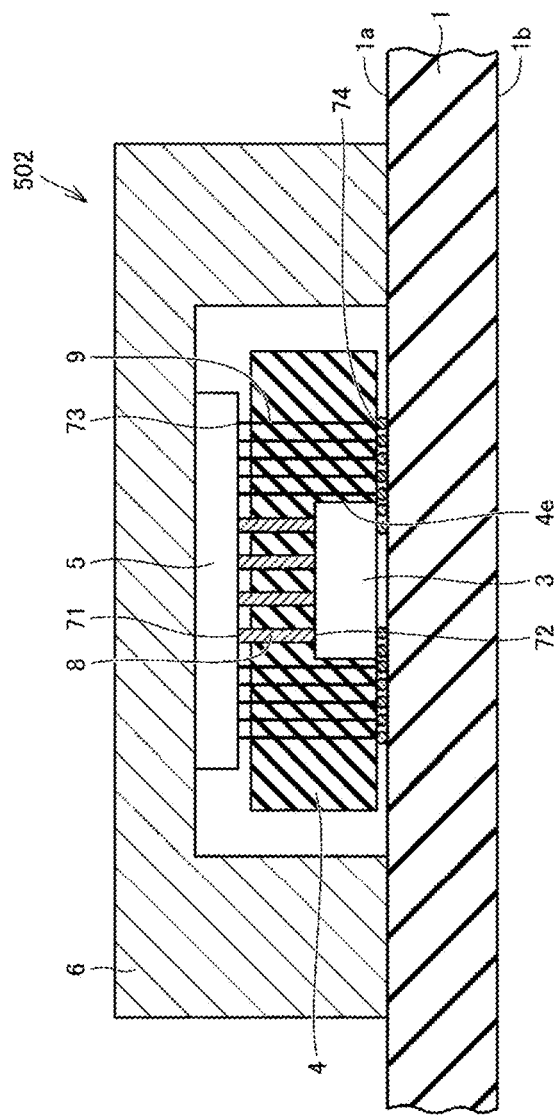
FIG. 4 is a sectional view of a structure with an electronic component according to a second preferred embodiment of the present invention.
Figure 5:
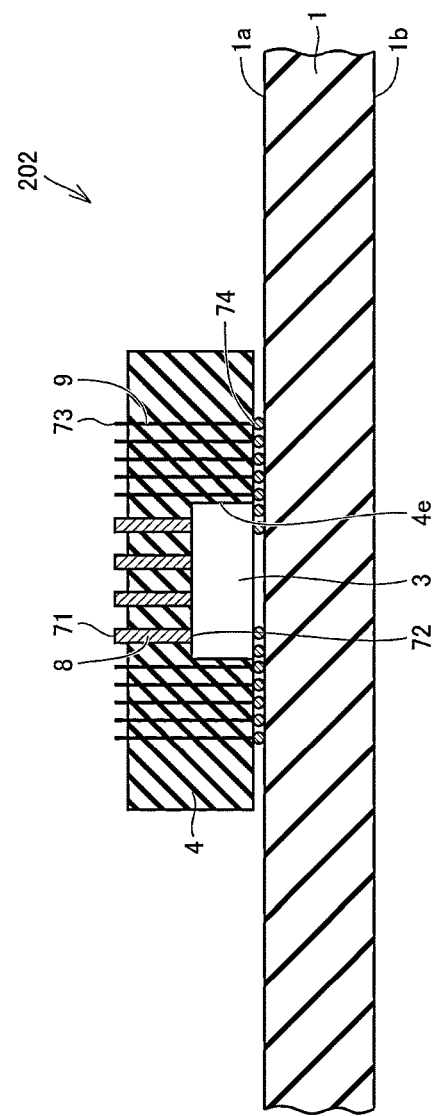
FIG. 5 is a sectional view of a structure according to the second preferred embodiment of the present invention.

With reference to FIGS. 4 to 5, a structure and a structure with an electronic component according to a second preferred embodiment of the present invention will be described. FIG. 4 is a sectional view of a structure with an electronic component 502. The structure with an electronic component 502 includes the electronic component 5 and the presser 6. The basic configurations of the electronic component 5 and the presser 6 are the same as those described in the first preferred embodiment.

FIG. 5 illustrates a state in which the electronic component 5 and the presser 6 are removed from the structure with an electronic component 502. FIG. 5 illustrates a structure 202. The electronic component 5 has been pressed against an upper surface of the structure 202 by the presser 6. The configuration of the structure 202 will be described below.

The basic configuration of the structure 202 is the same as that of the structure 201 described in the first preferred embodiment. However, while the structure 201 is a double-sided mounting structure, the structure 202 is a single-sided mounting structure.

In the structure 202, the socket 4 includes a power supply module receiving portion 4e to receive the power supply module 3. The power supply module 3 is disposed in the power supply module receiving portion 4e. The second end 72 is connected to the power supply module 3 in the power supply module receiving portion 4e. In the example shown here, the power supply module receiving portion 4e is a recessed portion provided on a lower surface of the socket 4. The socket 4 has a case shape, and the power supply module 3 is completely stored in the socket 4. That is, the power supply module 3 is disposed so as not to project from the lower surface of the socket 4. In the structure 202 according to the present preferred embodiment, each signal wiring 9 is longer than each power supply wiring 8. The power supply module 3 may be electrically connected to the first surface 1a of the main substrate 1.

In the present preferred embodiment, both of the electronic component 5 and the power supply module 3 can be disposed on one surface of the main substrate 1. Since the distance between the power supply module 3 and the electronic component 5 can be made short, the power supply wiring 8 can be made short. Since the power supply wiring 8 is short, a loss of electric energy can be further reduced or prevented.

Third Preferred Embodiment

Figure 6:
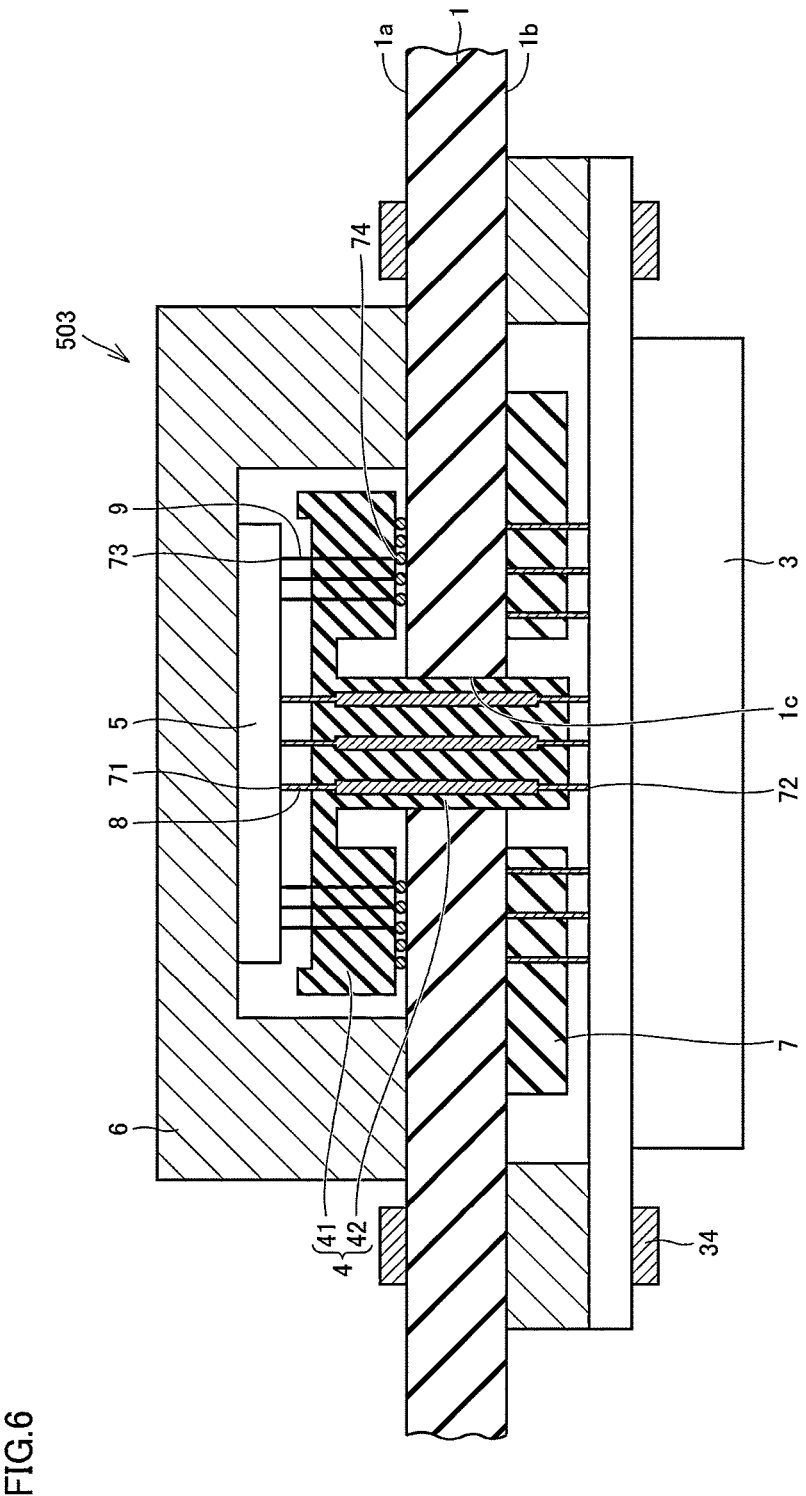
FIG. 6 is a sectional view of a structure with an electronic component according to a third preferred embodiment of the present invention.
Figure 7:
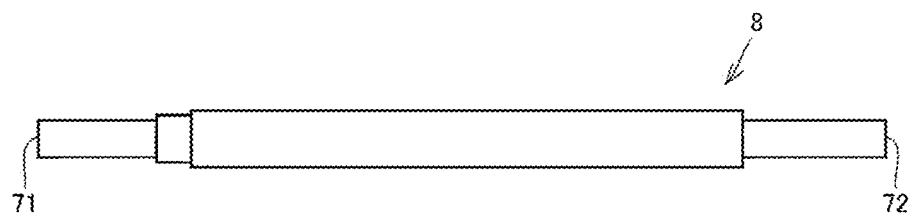
FIG. 7 is a side view of a power supply wiring included in a structure according to the third preferred embodiment of the present invention.
Figure 8:
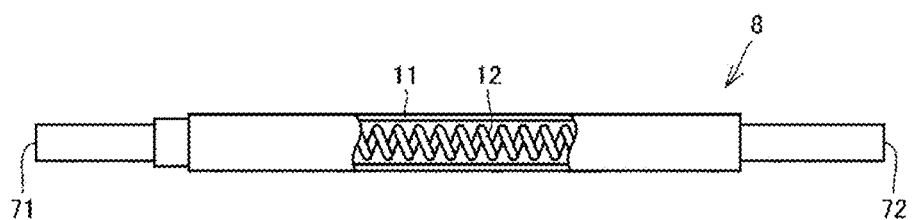
FIG. 8 is a view in which an internal structure of a portion of the power supply wiring included in the structure according to the third preferred embodiment of the present invention is visible.
Figure 9:
FIG. 9 is an example of a first shape of a first end of the power supply wiring.
Figure 10:
FIG. 10 is an example of a second shape of the first end of the power supply wiring.
Figure 11:
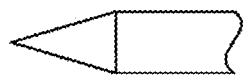
FIG. 11 is an example of a third shape of the first end of the power supply wiring.
Figure 12:
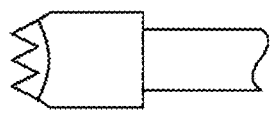
FIG. 12 is an example of a fourth shape of the first end of the power supply wiring.
Figure 13:
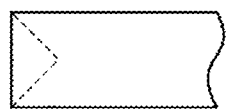
FIG. 13 is an example of a fifth shape of the first end of the power supply wiring.
Figure 14:
FIG. 14 is an example of a sixth shape of the first end of the power supply wiring.
Figure 15:
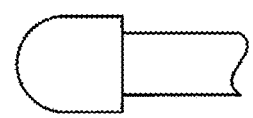
FIG. 15 is an example of a seventh shape of the first end of the power supply wiring.
Figure 16:
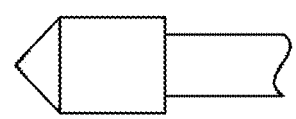
FIG. 16 is an example of an eighth shape of the first end of the power supply wiring.

With reference to FIGS. 6 to 8, a structure and a structure with an electronic component according to a third preferred embodiment of the present invention will be described. The basic configurations of the structure and the structure with an electronic component are the same as those that have been described thus far.

FIG. 6 is a sectional view of a structure with an electronic component 503 according to the present preferred embodiment. In the structure with an electronic component 503, at least any one of the first end 71, the second end 72, the third end 73, and the fourth end 74 may include an elastic structure that is elastically deformable when being pressed by an external force in the thickness direction of the main substrate 1 and resists the external force. FIG. 7 illustrates one power supply wiring 8 that has been taken out from the power supply wirings 8 which are individually used. FIG. 8 is a view in which the internal structure is visible in a portion of the power supply wiring 8. In the structure with an electronic component 503, the power supply wiring 8 includes a structure in which a spring 12 is disposed inside a cylindrical member 11. The first end 71 and the second end 72 can retreat by the elastic deformation of the spring 12 upon receiving an external force. On the other hand, the signal wiring 9 is not provided with the elastic structure.

On the upper surface of the socket 4, as illustrated in FIG. 6, a recessed portion corresponding to the electronic component 5 may be provided. In FIG. 6, the electronic component 5 is not stored in the recessed portion and is disposed at a position where the electronic component 5 is slightly floating, but this is merely an example. A portion or an entirety of the electronic component 5 may be stored in the recessed portion provided in the socket 4.

As in the case of the structure with an electronic component 503 according to the present preferred embodiment, by including an elastic structure, an end portion of the wiring is pressed against a facing member, such that electrical connection between the socket 4 and the electronic component 5 or electrical connection between the socket 4 and the power supply module 3 can be reliably performed.

Note that although the structure with an electronic component 503 has been described here, a structure according to the present preferred embodiment is a structure obtained by removing the electronic component 5 and the presser 6 from the structure with an electronic component 503.

Note that as illustrated in FIGS. 9 to 16, various structures can be considered for the structure of the first end 71 of the power supply wiring 8. In the example illustrated in FIG. 9, the tip simply has a flat surface. In the example illustrated in FIG. 10, the tip is provided with a portion having a large diameter, and the tip thereof has a flat surface. In the example illustrated in FIG. 11, the tip is pointed. In the example illustrated here, the tip has a conical shape. The tip may have a pyramidal shape, instead of a conical shape. In the example illustrated in FIG. 12, the tip is provided with a portion having a large diameter, and the tip surface thereof has an uneven surface. In the example illustrated in FIG. 13, the tip has a recessed portion. The shape of the recessed portion may have, for example, a conical shape as illustrated here. The shape of the recessed portion may have another shape. In the example illustrated in FIG. 14, the tip has a hemispherical surface. In the example illustrated in FIG. 15, the tip is provided with a portion having a large diameter, and the tip thereof has a hemispherical shape. In the example illustrated in FIG. 16, the tip is provided with a portion having a large diameter, and the tip thereof is pointed. In the example illustrated here, the tip has a conical shape.

Such a structure variation can be considered, and this also applies to the second end 72 of the power supply wiring 8. Moreover, such a structure variation also applies to the third end 73 of the signal wiring 9. Such a structure variation also applies to the fourth end 74 of the signal wiring 9.

Although both of the power supply wiring 8 and the signal wiring 9 may be provided with the elastic structure described above, in reality, considering the manufacturing cost, the wiring diameter, and the like, only a required wiring may be provided with the elastic structure.

Although an example in which the cylindrical member 11 includes the spring 12 inside has been described, the "elastic structure that is elastically deformed when being pressed by an external force in the thickness direction of the main substrate 1 and resists the external force" is not limited to an elastic structure using a coil spring.

Figure 17:
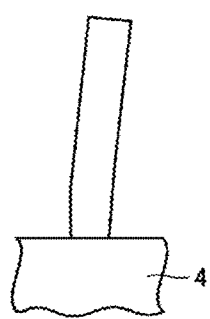
FIG. 17 is a first side view of a first example of a tip of a wiring.
Figure 18:
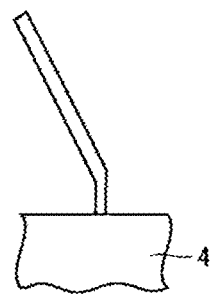
FIG. 18 is a second side view of the first example of the tip of the wiring.

For example, as a first example, the tip of the wiring may have the structure illustrated in FIGS. 17 and 18. FIG. 17 illustrates a state in which a portion of the wiring projects from a surface of the socket 4. FIG. 18 illustrates the same structure as the structure illustrated in FIG. 17 when viewed in a direction different by about 90 degrees from FIG. 17, for example. The end portion of the wiring is a thin plate and is bent to some degree. That is, the end portion of the wiring is a plate spring.

Figure 19:
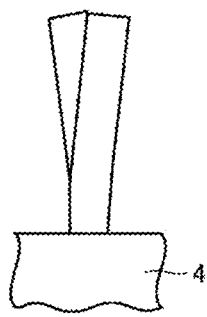
FIG. 19 is a first side view of a second example of a tip of a wiring.
Figure 20:
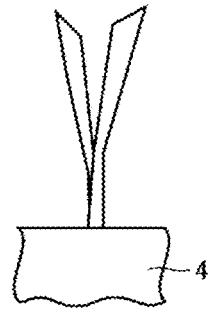
FIG. 20 is a second side view of the second example of the tip of the wiring.

In addition, as a second example, for example, the tip of the wiring may have the structure illustrated in FIGS. 19 and 20. FIG. 19 illustrates a state in which a portion of the wiring projects from a surface of the socket 4. FIG. 20 illustrates the same structure as the structure illustrated in FIG. 19 when viewed in a direction different by about 90 degrees from FIG. 19, for example. The end portion of the wiring has a structure obtained by combining two thin plates. The two thin plates are both plate springs. The two thin plates form a Y-shape. When the end portion of the wiring defines a Y-shape in this manner, the Y-shape may pinch an end portion of a terminal to which the wiring is to be connected so as to establish electrical connection.

Fourth Preferred Embodiment

Figure 21:
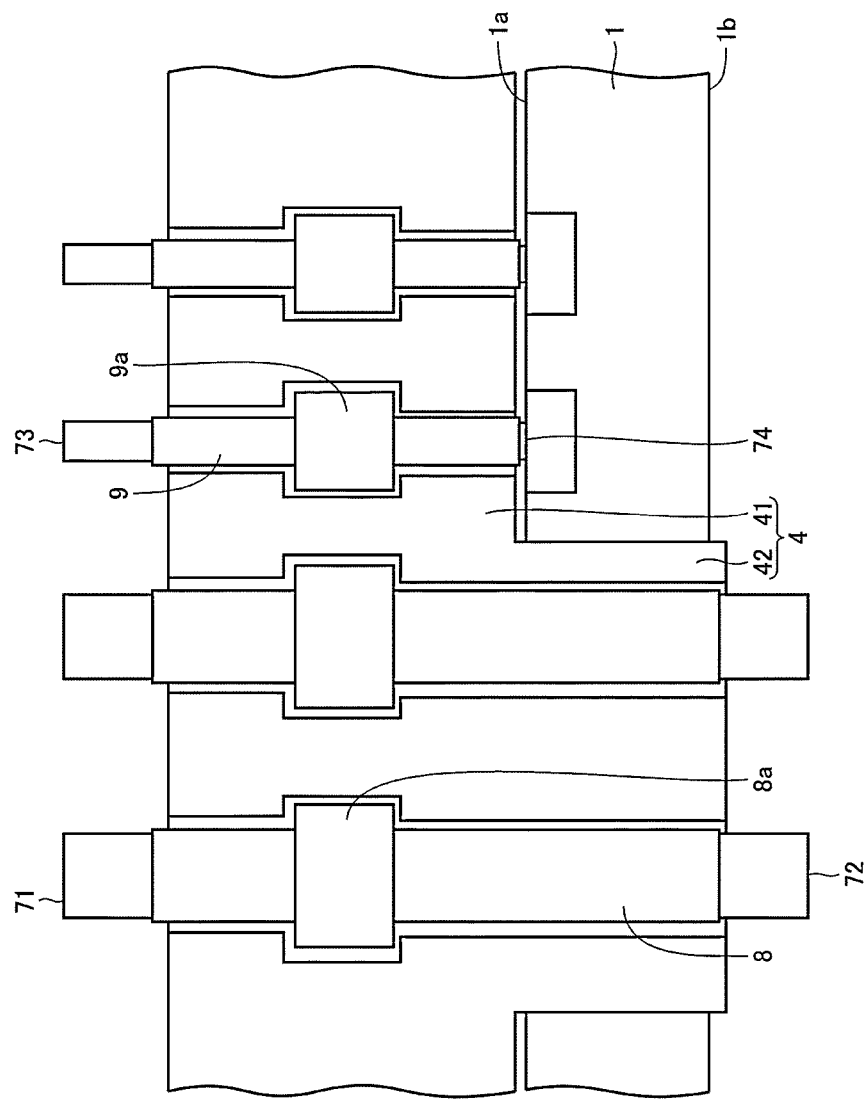
FIG. 21 is a partially enlarged sectional view of a structure according to a fourth preferred embodiment of the present invention.

With reference to FIG. 21, a structure and a structure with an electronic component according to a fourth preferred embodiment of the present invention will be described. The basic configurations of the structure and the structure with an electronic component are the same as those that have described thus far.

FIG. 21 illustrates the structure according to the present preferred embodiment, a part of which is enlarged. The power supply wiring 8 and the signal wiring 9 penetrate the socket 4. The power supply wiring 8 includes an extending portion 8a, which is a portion having a large diameter at a middle portion of the power supply wiring 8. The signal wiring 9 includes an extending portion 9a, which is a portion having a large diameter at a middle part of the signal wiring 9. The socket 4 has a hollow portion so as to wrap the extending portions 8a and 9a. Since the extending portions 8a and 9a are closed in the hollow portion, the power supply wiring 8 and the signal wiring 9 are held without falling out of the socket 4. The socket 4 having such a hollow portion can be manufactured by, for example, being resin-molded twice. That is, a half of the socket 4 is molded first, and at this point, the hollow portion is formed as a recessed portion. After disposing the wiring having the extending portion in the recessed portion, the remaining half of the socket 4 may be molded.

As the structure according to the present preferred embodiment, the structures of other portions are the same as the structures that have been described in the above preferred embodiments, and thus the description is not repeated. In addition, the structure with an electronic component according to the present preferred embodiment is the structure according to the present preferred embodiment with the electronic component 5 and the presser 6 added.

In the structure according to the present preferred embodiment, since the power supply wiring 8 and the signal wiring 9 that penetrate the socket 4 include the extending portions 8a and 9a at the middle portions, respectively, the power supply wiring 8 and the signal wiring 9 are stably disposed without falling out of the socket 4.

Fifth Preferred Embodiment

Figure 22:
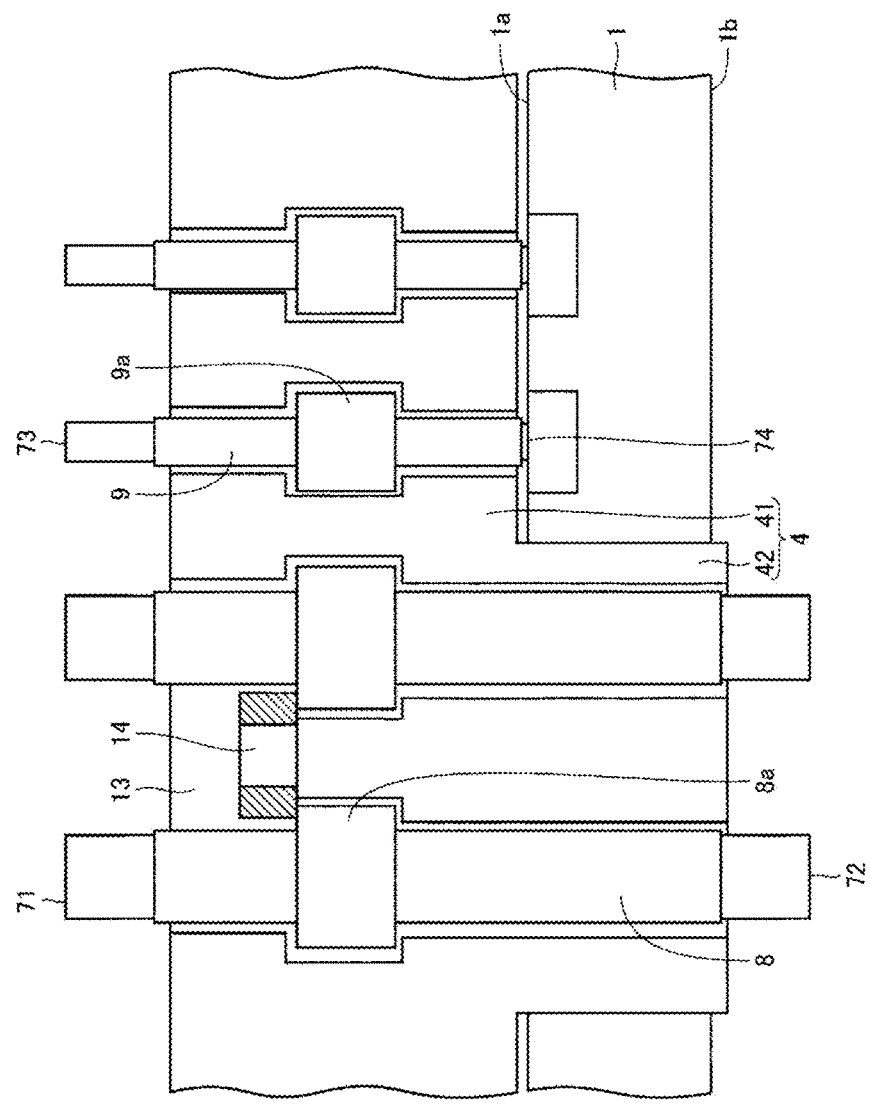
FIG. 22 is a partially enlarged sectional view of a structure according to a fifth preferred embodiment of the present invention.

With reference to FIG. 22, a structure and a structure with an electronic component according to a fifth preferred embodiment of the present invention will be described. The basic configurations of the structure and the structure with an electronic component are the same as those described in the fourth preferred embodiment. FIG. 22 illustrates the structure according to the present preferred embodiment, a portion of which is enlarged.

Figure 23:
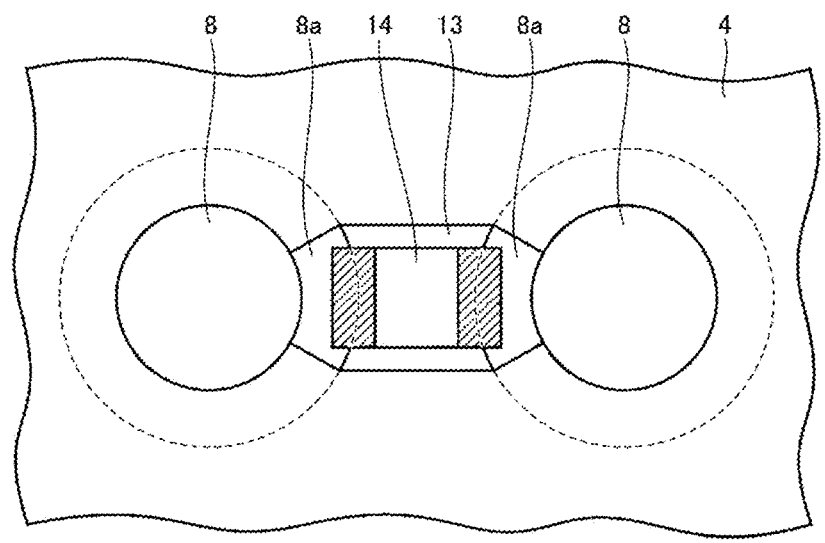
FIG. 23 is a partial plan view of the structure according to the fifth preferred embodiment of the present invention.

In the structure according to the present preferred embodiment, the socket 4 includes a chip component receiving portion 13 to receive a chip component. The chip component receiving portion 13 is a recessed portion. A capacitor 14 is disposed, as the chip component, in the chip component receiving portion 13. The chip component is electrically connected to the power supply wiring 8. FIG. 23 illustrates the capacitor 14 and the vicinity thereof when viewed directly from above in FIG. 22. The capacitor 14 disposed in the chip component receiving portion 13 is visible. Inside the chip component receiving portion 13, a portion of the extending portion 8a is also visible. The chip component is disposed so as to overlap with the extending portion 8a and thus electrically connected to the power supply wiring 8.

As the structure according to the present preferred embodiment, the structures of other portions are the same as the structures that have been described in the above preferred embodiments, and thus the description is not repeated. In addition, the structure with an electronic component according to the present preferred embodiment is the structure according to the present preferred embodiment with the electronic component 5 and the presser 6 added.

In the present preferred embodiment, since the chip component is provided in the chip component receiving portion 13 provided in the socket 4, a necessary or desired chip component can be provided. Here, it has been described that the chip component receiving portion 13 is a recessed portion, but the chip component receiving portion 13 is not limited to being a recessed portion, and may be a cutout.

As illustrated in the present preferred embodiment, the chip component that is disposed in the chip component receiving portion 13 is preferably the capacitor 14. The capacitor 14 as a chip component includes an outer electrode at each end. The outer electrode of the capacitor 14 on one side is preferably connected to one power supply wiring 8, and the outer electrode on the other side is preferably connected to another power supply wiring 8. The outer electrodes and the power supply wirings 8 may be connected by soldering. However, the two power supply wirings are a pair of power supply wirings that supplies power to one electronic component 5. That is, one of the two power supply wirings is a GND wiring. By adopting this configuration, the capacitor 14 defines and functions as a bias capacitor and is useful for elimination of noise from the energy supplied to the electronic component 5.

Sixth Preferred Embodiment

Figure 24:
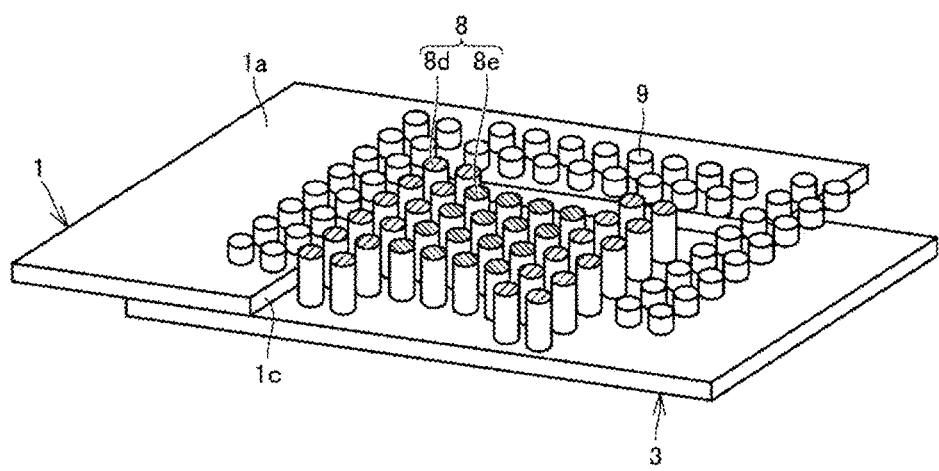
FIG. 24 is a partially enlarged perspective view of a structure according to a sixth preferred embodiment of the present invention.

With reference to FIG. 24, a structure and a structure with an electronic component according to a sixth preferred embodiment of the present invention will be described. The basic configurations of the structure and the structure with an electronic component are the same as those described in the fourth preferred embodiment. FIG. 24 illustrates the structure according to the present preferred embodiment, a portion of which is enlarged. In this figure, for the convenience of description, assuming that the socket 4 is transparent and invisible, the power supply wirings 8 and the signal wirings 9 are illustrated. Therefore, in FIG. 24, wirings, most of which are normally hidden by the socket 4, are illustrated as though the wirings have been exposed and disposed.

In the present preferred embodiment, the one or more power supply wirings 8 include one or more GND wirings 8d that are grounded and one or more non-GND wirings 8e that are not grounded, and the one or more GND wirings 8d are disposed between the one or more non-GND wirings 8e and the one or more signal wirings 9.

As the structure according to the present preferred embodiment, the structures of other portions are the same as the structures that have been described in the above preferred embodiments, and thus the description is not repeated. In addition, the structure with an electronic component according to the present preferred embodiment is the structure according to the present preferred embodiment with the electronic component 5 and the presser 6 added.

In the present preferred embodiment, since the one or more GND wirings 8d are disposed between the one or more non-GND wirings 8e and the one or more signal wirings 9, the arrangement of the one or more GND wirings 8d defines and functions as a shield, thus reducing or preventing transmission of electromagnetic waves generated, as noise, from the one or more non-GND wirings 8e to the signal wirings 9.

Note that in the example illustrated in FIG. 24, a plurality of the non-GND wirings 8e define a 4×4 square, and the GND wirings 8d extend along two parallel or substantially parallel sides of the square of the non-GND wirings 8e, but this is merely an example. The GND wirings 8d may extend along only one side or three sides of the non-GND wirings 8e, instead of two sides of the non-GND wirings 8e. The GND wirings 8d may surround the whole periphery of the arrangement of the non-GND wirings 8e. The number of wirings and the shape of the arrangement illustrated in FIG. 24 are examples for the description, and the number of wirings and the shape of the arrangement are not limited thereto.

Figure 25:
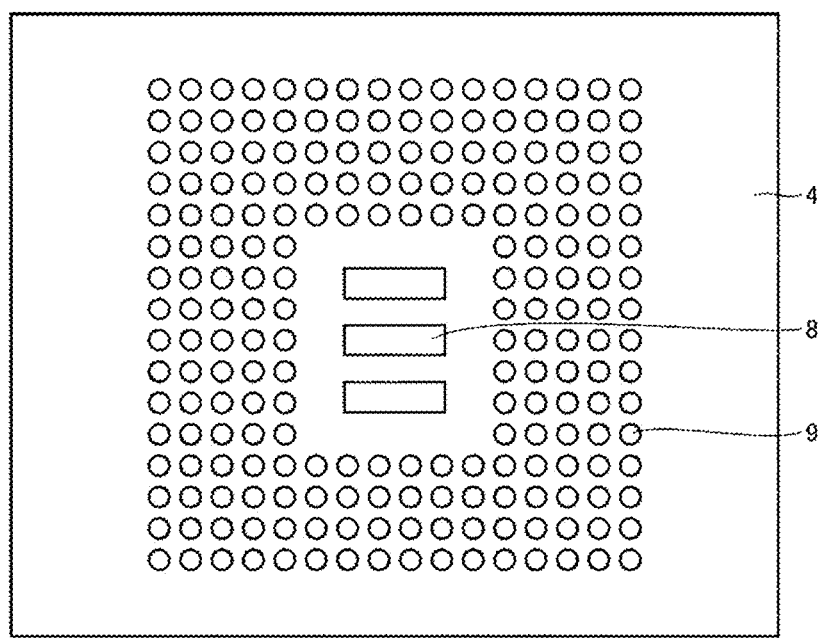
FIG. 25 is a plan view of a socket that can be used in a structure according to a preferred embodiment of the present invention.

Note that in the above-described preferred embodiments, each power wiring 8 and each signal wiring 9 have a columnar shape, but the sectional shape of the wirings is not limited to a circle. For example, as illustrated in FIG. 25, a portion or an entirety of the wirings to be arranged may have a shape other than a circle. FIG. 25 is a plan view of only a portion of the socket 4. In this example, the sectional shape of the power supply wiring 8 is a rectangle. Three power supply wirings 8 are disposed in the center, and a large number of signal wirings 9 surround the three power supply wirings 8. This configuration is also applicable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A structure comprising:
   a main substrate including a first surface and a second surface facing a side opposite to the first surface;
   a power supply module on the main substrate;
   a socket in the main substrate; and
   one or more power supply wirings and one or more signal wirings that extend in a thickness direction of the main substrate and penetrate the socket; wherein
   each of the one or more power supply wirings has a first end on the first surface side and a second end on a side opposite to the first end;
   each of the one or more signal wirings includes a third end to be electrically connected to an electronic component and a fourth end on a side opposite to the third end;
   the fourth end is electrically connected to a conductor pattern on the first surface;
   the main substrate includes a through hole that connects the first surface to the second surface;
   the power supply module is provided on the second surface;
   the socket is provided on the first surface and includes a main body portion along the first surface and a projecting portion projecting from the main body portion and inserted into the through hole;

the one or more power supply wirings penetrate the projecting portion;

the one or more power supply wirings include a first power supply wiring having a length longer than a length of a first signal wiring included in the one or more signal wirings;

the socket includes a power supply module receiving portion to receive the power supply module;

the power supply module is in the power supply module receiving portion;

the second end is connected to the power supply module in the power supply module receiving portion; and the one or more power supply wirings are thicker than the one or more signal wirings.

2. The structure according to claim 1, wherein the one or more power supply wirings include a first power supply wiring having a length different from a length of a first signal wiring included in the one or more signal wirings.

3. The structure according to claim 1, wherein when the socket is viewed in a direction perpendicular or substantially perpendicular to the first surface, the one or more signal wirings surround the one or more power supply wirings.

4. The structure according to claim 1, wherein
the socket includes a chip component receiving portion to receive a chip component;
the chip component is in the chip component receiving portion; and
the chip component is electrically connected to the power supply wirings.

5. The structure according to claim 4, wherein the chip component is a capacitor.

6. The structure according to claim 1, wherein at least any one of the first end, the second end, the third end, and the fourth end includes an elastic structure that is elastically deformable when being pressed in a thickness direction of the main substrate by an external force and resists the external force.

7. The structure according to claim 1, wherein
the one or more power supply wirings include one or more GND wirings that are grounded and one or more non-GND wirings that are not grounded; and
the one or more GND wirings are between the one or more non-GND wirings and the one or more signal wirings.

8. The structure according to claim 1, wherein the first end and the third end are on a same plane surface.

9. A structure with an electronic component comprising:
the structure according to claim 1; and
the electronic component; wherein
the first end and the third end are electrically connected to the electronic component.

10. The structure with the electronic component according to claim 9, wherein the one or more power supply wirings include a first power supply wiring having a length different from a length of a first signal wiring included in the one or more signal wirings.

11. The structure with the electronic component according to claim 9, wherein when the socket is viewed in a direction perpendicular or substantially perpendicular to the first surface, the one or more signal wirings surround the one or more power supply wirings.

12. The structure with the electronic component according to claim 9, wherein
the socket includes a chip component receiving portion to receive a chip component;
the chip component is in the chip component receiving portion; and
the chip component is electrically connected to the power supply wirings.

13. The structure with the electronic component according to claim 12, wherein the chip component is a capacitor.

14. The structure with the electronic component according to claim 9, wherein at least any one of the first end, the second end, the third end, and the fourth end includes an elastic structure that is elastically deformable when being pressed in a thickness direction of the main substrate by an external force and resists the external force.

15. The structure with the electronic component according to claim 9, wherein
the one or more power supply wirings include one or more GND wirings that are grounded and one or more non-GND wirings that are not grounded; and
the one or more GND wirings are between the one or more non-GND wirings and the one or more signal wirings.

16. The structure with the electronic component according to claim 9, wherein the first end and the third end are on a same plane surface.

* * * * *